United States Patent
Chang et al.

(10) Patent No.: US 7,924,204 B2
(45) Date of Patent: Apr. 12, 2011

(54) STAGE-RESOLUTION SCALABLE OPAMP-SHARING TECHNIQUE FOR PIPELINED/CYCLIC ADC

(75) Inventors: Soon-Jyh Chang, Tainan (TW); Jin-Fu Lin, Tainan (TW); Chih-Haur Huang, Tainan (TW)

(73) Assignees: Himax Media Solutions, Inc., Tainan County (TW); NCKU Research and Development Foundation, Tainan (TW)

( * ) Notice: Subject to any disclaimer, the term of this patent is extended or adjusted under 35 U.S.C. 154(b) by 126 days.

(21) Appl. No.: 12/247,186

(22) Filed: Oct. 7, 2008

(65) Prior Publication Data

US 2010/0085227 A1 Apr. 8, 2010

(51) Int. Cl.
*H03M 1/38* (2006.01)

(52) U.S. Cl. .................... 341/161; 341/155

(58) Field of Classification Search ........... 341/161, 341/162, 155, 163, 118, 120
See application file for complete search history.

(56) References Cited

U.S. PATENT DOCUMENTS

| | | | | |
|---|---|---|---|---|
| 6,486,820 B1 * | 11/2002 | Allworth et al. | | 341/161 |
| 6,577,185 B1 * | 6/2003 | Chandler et al. | | 330/9 |
| 6,879,277 B1 * | 4/2005 | Cai | | 341/155 |
| 7,576,677 B2 * | 8/2009 | Morimoto | | 341/162 |
| 7,595,748 B2 * | 9/2009 | Tu | | 341/188 |
| 2002/0039077 A1 * | 4/2002 | Lyden | | 341/156 |

* cited by examiner

*Primary Examiner* — Joseph Lauture

(74) *Attorney, Agent, or Firm* — Stout, Uxa, Buyan & Mullins, LLP

(57) ABSTRACT

An analog-to-digital converter (ADC) for pipelined ADCs or cyclic ADCs is disclosed. The ADC includes at least one pair of two stages connected in series, and the two stages have different bits of resolution. An amplifier is shared by the pair of two stages such that the two stages operate in an interleaved manner. Accordingly, this stage-resolution scalable opamp-sharing technique is adaptable for pipelined ADC or cyclic ADC, which substantially reduces power consumption and increases operating speed.

21 Claims, 7 Drawing Sheets

US 7,924,204 B2

STAGE-RESOLUTION SCALABLE OPAMP-SHARING TECHNIQUE FOR PIPELINED/CYCLIC ADC

BACKGROUND OF THE INVENTION

1. Fiend of the Invention

The present invention generally relates to analog-to-digital converters (ADCs), and more particularly to a stage-resolution scalable opamp-sharing technique adaptable for pipelined ADCs or cyclic ADCs that can substantially reduce the amount of operational amplifiers and associated power consumption, and increase operating speed.

2. Description of the Prior Art

Growing demands for portable communication and audio/video electronic devices call for longer operating times. Battery power alone, however, cannot keep up with the pressing need for longer operating time. Reducing power consumption is thus becoming an alternative and more feasible way to reach the object of augmenting the operating times for such devices.

The pipelined analog-to-digital converter (ADC) is widely utilized, over other ADC architectures, in video applications for the reason that its hardware requirement linearly increases with the associated resolution, instead of the exponential increases associated with flash ADC architectures. For applications with 10 bits of resolution, for example, the hardware requirement, and accordingly the required silicon area and power consumption, of the pipelined ADC are substantially lower than other ADC architectures.

FIG. 1 illustrates a conventional pipelined ADC architecture 1. The input signal $V_{in}$ is first sampled by a front-end sample-and-hold amplifier (SHA) 11, which then provides a stably held signal to a later stage 12. Each stage 12 performs a portion of bits (B) of conversion, respectively. The converted bits are synchronized by delay elements 13, and then corrected and integrated by a digital error correction logic 14, finally outputting a complete N-bit code, where N is the ADC resolution. As shown in the expanded block, each stage 12 includes a sub-ADC 121, a sub-DAC (digital-to-analog converter) 122, a SHA 123, an analog subtractor 124 and an amplifier ($G_i$) 125. The sub-ADC 121 of each stage 12 performs coarse quantization on its corresponding input signal to generate a portion of bits, which is then converted into associated analog voltage by the sub-DAC 122. The converted analog voltage is subsequently subtracted from the sampled input signal by the subtractor 124, resulting in residual signal 126 which represents quantization error of the input signal through the associated stage 12. The residual signal 126 is then amplified by the amplifier 125, such that the value of the residual signal 126 is within the signal range of the overall ADC 1. Accordingly, the reference voltage can be shared among the stages 12, thereby simplifying the system design. Further, as the bits of resolution become less through more stages while the signal range is maintained, later stages therefore have a precision requirement less stringent than preceding stages.

FIG. 2 illustrates an implementation of a multiplying DAC (MDAC) 120 consisting of the sub-DAC 122, the SHA 123, the analog subtractor 124 and the amplifier ($G_i$) 125 (such as an operational amplifier or opamp). The MDAC 120 is implemented, in this example, with a switched-capacitor circuit as connected, and performs 1.5 bits of conversion in each stage (i.e., 1.5-bit/stage). When clock clk1 becomes high ("1"), the MDAC 120 enters into sample phase, the amplifier 125 has a unity gain configuration and the offset ($V_{os}$) of the amplifier 125 is stored in the upper plates of the capacitors $C_f$ and $C_s$ (near the input node of the amplifier 125). Subsequently, when clock clk2 becomes high ("1"), the MDAC 120 enters into amplify phase, the capacitor $C_f$ acts as feedback capacitor and the bottom plate of the capacitor $C_s$ is connected to the output voltage $V_R$ of the sub-DAC 122, thereby amplifying the residual signal and correcting the offset in this phase. The precision of the MDAC 120 determines the precision of the overall ADC 1, while the precision of the MDAC 120 itself is determined by the effective parameters, such as gain and bandwidth, of the amplifier 125. In addition, as the amplifiers 125 consume considerable power in the overall ADC 1, making effort to reduce the power consumption in the amplifiers 125 becomes critical in substantially reducing power consumption in the overall ADC 1. Further, as later stages have precision requirements less stringent than preceding stages, amplifiers 125 with lower gain and bandwidth may be used to substantially reduce the power consumption. Nevertheless, this requires designing variety of or among amplifiers, which translates into more circuit design time.

In general, as the pipelined ADC 1 with the digital error correction logic 14 can tolerate considerable offset, the offset of the amplifiers 125 will not substantively affect the linearity characteristics of the overall ADC 1, provided that the offset does not exceed the tolerable range of the digital error correction logic 14. Accordingly, the MDAC 120 does not need offset correction. Therefore, when the clock clk1 becomes high ("1"), there is no need to set up the amplifier 125 in a unity gain configuration to store the offset. In other words, the amplifier 125 is idle in the sample phase as shown in FIG. 3. The capability of utilizing the idle amplifier 125 in the sample phase will further reduce the overall power consumption as disclosed in the following techniques.

(1) Double-Sampling Technique

FIG. 4 illustrates a two-channel time-interleaved architecture 4, which is used to accelerate the overall ADC operation. As the sample phase and amplify phase are time-interleaved, that is, one channel 40 is under sampling while the other channel 41 is under amplifying, the two channels will not use the (operational) amplifier 42 at the same time. Accordingly, the amplifier 42 can be shared, such that the operating speed of each stage can be doubled, or, in other words, the bandwidth of the amplifier 42 can be reduced in half, thereby substantially reducing power consumption. Despite the advantages mentioned above, this technique nevertheless requires an additional pair of capacitors (or more silicon area) for switching between the channels. Further, more circuits, and thus more power consumption and silicon area, are required to cope with channel mismatch issues, such as timing mismatch, offset mismatch and gain mismatch.

(2) Opamp Sharing Technique

As the operation of the two neighboring stages in a pipelined ADC is also interleaved, that is, one stage is under sampling while another neighboring stage is under amplifying, the two neighboring stages may share an opamp to reduce the power consumption in half, as shown in FIG. 5. The ADC 5 shown in FIG. 5 adopts the same stage-resolution for every pipelined stage. Thus, the accuracy requirement of the shared amplifier 52 needs to conform to that of the former stage. Since the precision requirement of the later stage (e.g., stage 2) in general is less stringent than that of the preceding stage (e.g., stage 1), sharing of the preceding-stage's amplifier 52 with the later stage is disadvantageous and wasteful. The opamp sharing technique consumes more power than the double-sampling technique for the reason that the double-sampling technique can reduce the bandwidth in half and be optimized according to the precision requirement in each stage. On the contrary, the opamp sharing technique avoids channel mismatch issues and associated correction scheme and circuit design complexity compared with the double-sampling technique.

For the reason that the above-mentioned conventional ADC architectures have respective disadvantages, a need has arisen to propose a novel ADC architecture that can maintain the advantages while avoid the disadvantages of conventional ADC architectures.

SUMMARY OF THE INVENTION

In view of the foregoing, it is an object of the present invention to provide a stage-resolution scalable opamp-sharing technique adaptable for pipelined ADC or cyclic ADC for substantially reducing power consumption and increasing operating speed.

According to one embodiment, a stage-resolution scalable opamp-sharing pipelined ADC includes a number of series-connected pairs each having two stages connected in series. The preceding stage of the pair operates fewer bits (for example, 1.5-bit/stage) of conversion than the later stage of the same pair (for example, 2.5-bit/stage). Each pair of stages shares an operational amplifier (op-amp or opamp), wherein the two stages operate in an interleaved manner such that one stage of the pair is sampling while another stage of the same pair is amplifying; therefore the two stages do not use the shared opamp at the same time. Accordingly, the pipelined ADC of the embodiment uses fewer opamps and consumes less power than conventional ADC architectures.

According to another embodiment, a stage-resolution scalable opamp-sharing cyclic ADC includes a pair of two stages connected in series. The preceding stage of the pair operates fewer bits of conversion (for example, 1.5-bit/stage) than the later stage of the same pair (for example, 2.5-bit/stage). The stages share an opamp, wherein the two stages operate in an interleaved manner such that one stage of the pair is sampling while another stage of the pair is amplifying, therefore the two stages do not use the shared opamp at the same time. The output of the later stage is fed back, through an analog multiplexer, to the preceding stage after an end of a cycle of conversion. Accordingly, the cyclic ADC of the embodiment operates faster than a conventional cyclic ADC.

DETAILED DESCRIPTION OF THE INVENTION

Figure 1:
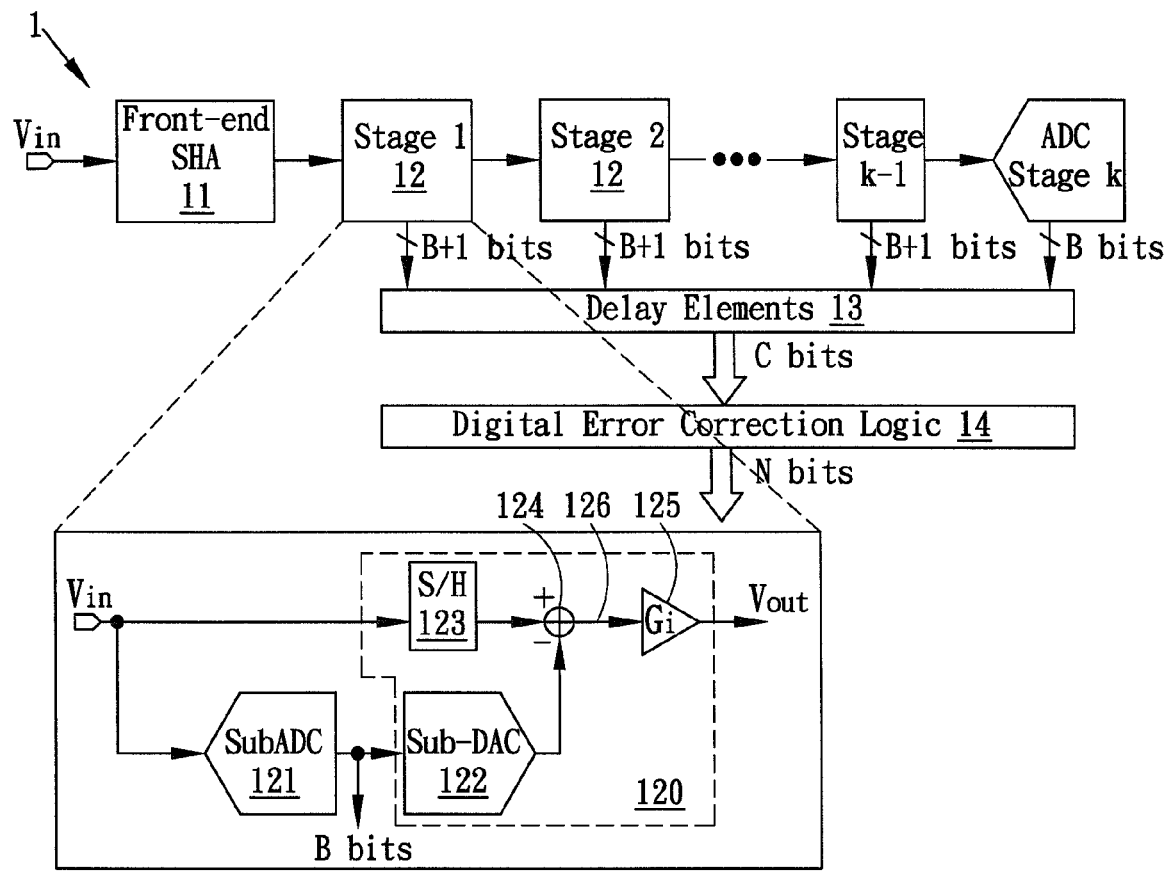
FIG. 1 illustrates a conventional pipelined ADC architecture.
Figure 2:
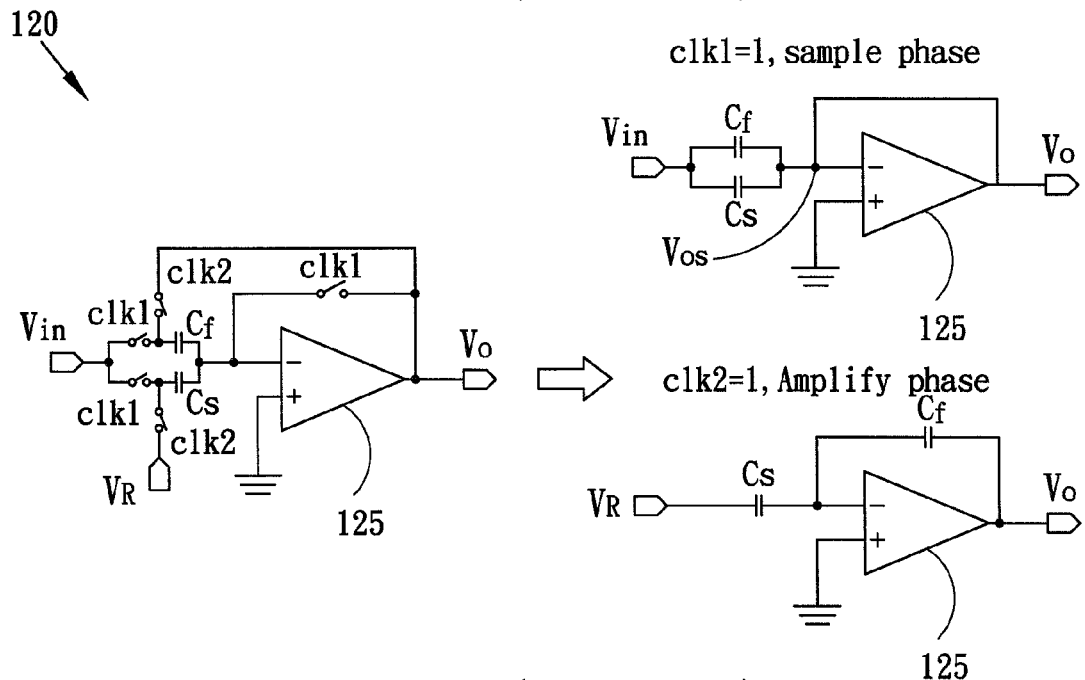
FIG. 2 illustrates an implementation of a multiplying DAC (MDAC)
Figure 3:
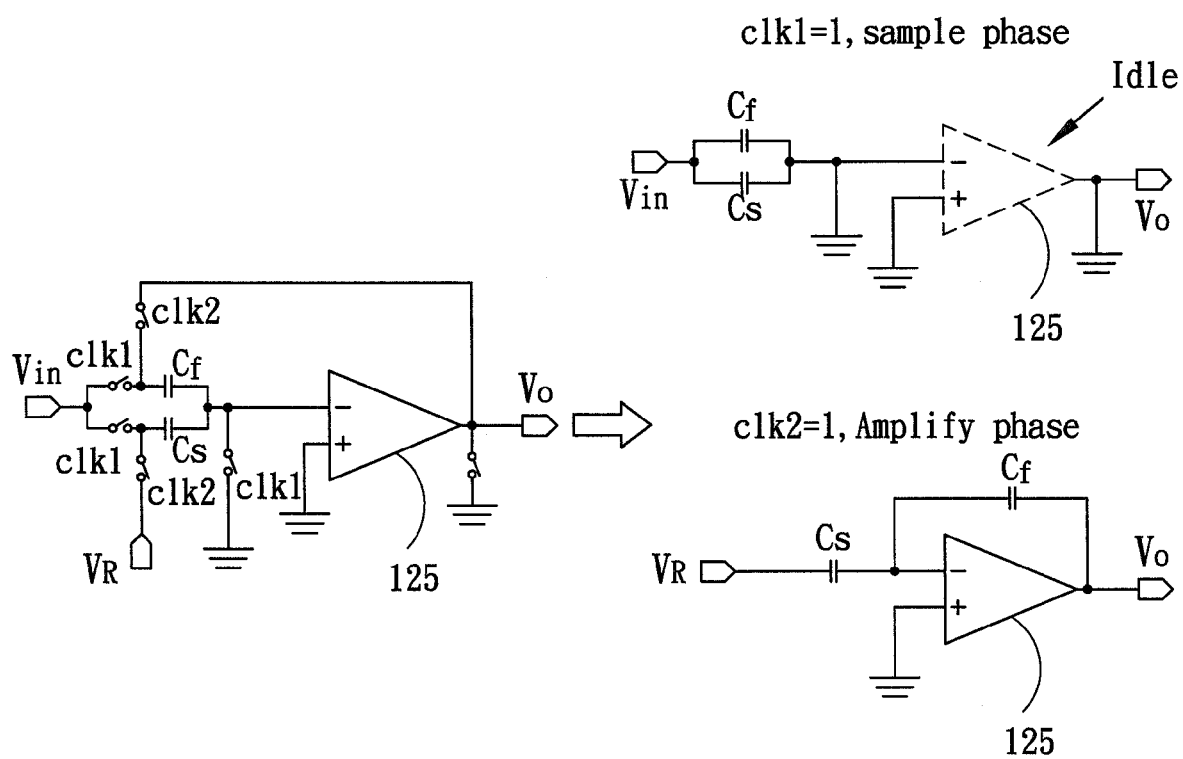
FIG. 3 illustrates the MDAC, in which the amplifier is idle in the sample phase.
Figures 6, 7A:
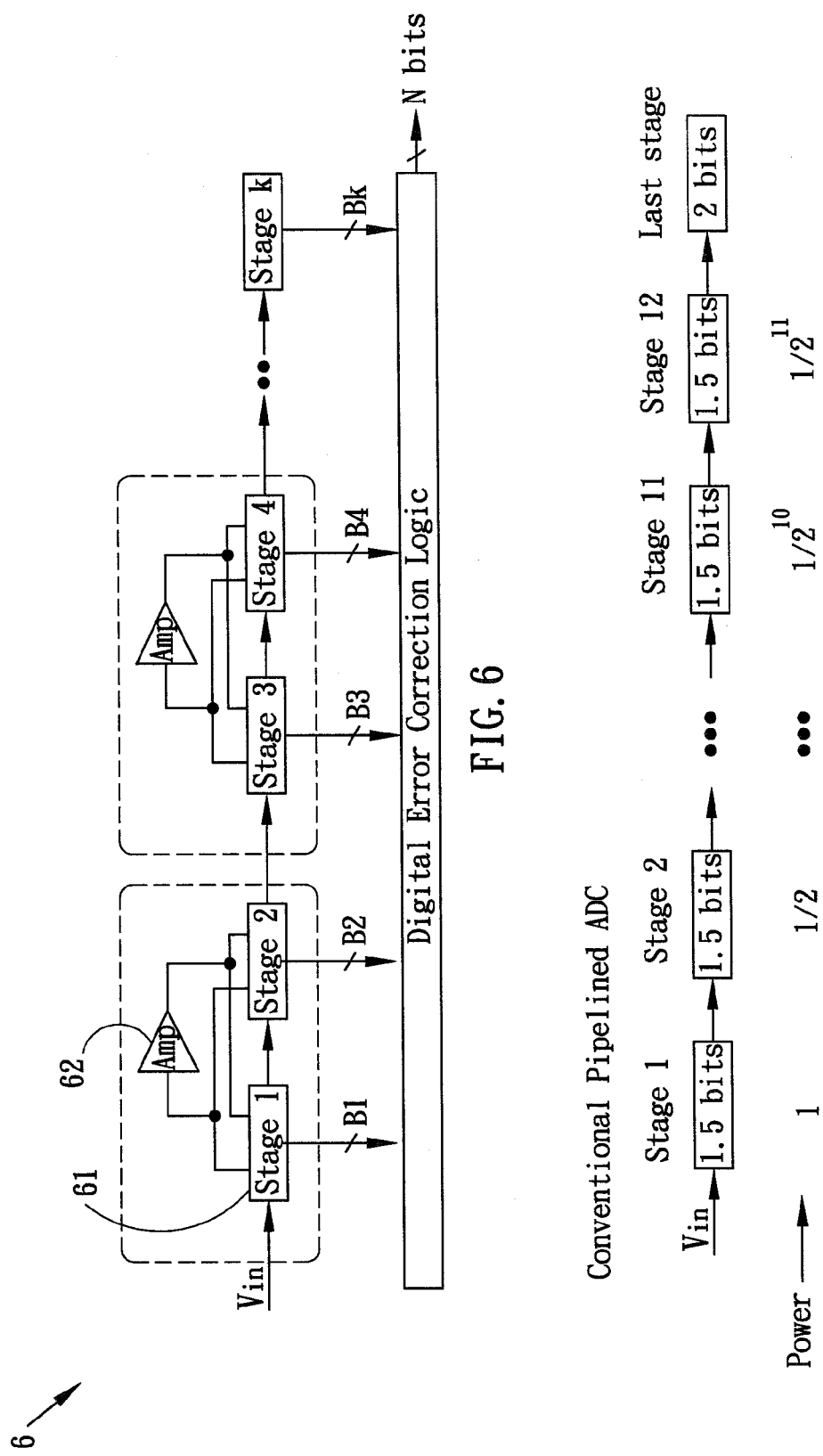
FIG. 6 illustrates a stage-resolution scalable opamp-sharing technique for pipelined ADC according to one embodiment of the present invention.
FIG. 7A to FIG. 7D demonstrate a comparison of the power consumption among the conventional pipelined ADC (FIG. 1), the double-sampling technique (FIG. 4), the opamp sharing technique (FIG. 5) and the embodiment of the present invention (FIG. 6)

FIG. 6 illustrates a stage-resolution scalable opamp-sharing technique for a pipelined analog-to-digital converter (ADC) 6 according to one embodiment of the present invention. In the embodiment, the ADC 6 adopts different stage-resolution for every pipelined stage. Specifically, every two neighboring stages 61 (for example, stage 1 and stage 2) share an amplifier 62, such as an operational amplifier (op-amp or opamp). The two neighboring stages operate in an interleaved manner, that is, one stage undergoes or is under sampling while another neighboring stage undergoes or is under amplifying, so that the two stages will not use the amplifier 62 at the same time, thereby reducing power consumption (e.g., in half). Each stage 61 has composing elements (such as the sub-ADC, the sub-DAC, the sample-and-hold amplifier (SHA) and the analog subtractor) connected similarly to that depicted in FIG. 1, wherein the multiplying DAC (MDAC) consist of the sub-DAC, the SHA and the analog subtractor. In FIG. 6, the ADC 6 may further include delay elements (not shown in FIG. 6) similar to that depicted in FIG. 1, and may further include a front-end SHA (not shown in FIG. 6) similar to that depicted in FIG. 1. The discussion of the connection and the operation of all of these composing elements are thus omitted here for brevity.

In the embodiment of the present invention, the preceding stage (such as the stage 1) of the two neighboring stages has fewer bits of resolution than that of the later stage (such as the stage 2). Accordingly, as the two stages have different amplifications, the feedback factors of respective MDACs are thus different, resulting in larger error for the later stage. This error would not affect the overall performance because the later stage generally has a precision requirement less stringent than that of the preceding stage.

In an exemplary embodiment, in which the preceding stage performs 1.5 bits of conversion (i.e., 1.5-bit/stage) and the later stage performs 2.5 bits of conversion (i.e., 2.5-bit/stage), the feedback factor of the preceding stage is ½ ($C_f=C_s$) and the feedback factor of the later stage is ¼ ($C_s=3 \times C_f$). It is appreciated by a person skilled in the pertinent art that a bit allocation other than 1.5/2.5-bits/stage may be adopted provided that the later stage performs more bit(s) of conversion than that of the neighboring preceding stage. The difference between the feedback factors brings forth the following issues.

1. Different Feedback Error

As the feedback error (e) is inversely proportional to the product of gain (A) of the amplifier and the feedback factor (β), that is, $$e \approx \frac{1}{A\beta},$$

the later stage has larger error due to its smaller feedback factor. As discussed above, this error can be tolerated because the later stage generally has a precision requirement less stringent than the preceding stage in a pipelined ADC.

2. Different Settling Time

In a feedback system, a smaller feedback factor results in smaller feedback bandwidth or longer settling time. With respect to the embodiment, the later stage has a longer settling time and settling error compared to the preceding stage. Nevertheless, this error can be tolerated because the later stage generally has a precision requirement less stringent than the preceding stage in a pipelined ADC.

3. Different Phase Margin

In a feedback system, a different feedback factor results in a different phase margin, which may affect the circuit stability. Specifically, a system with a larger feedback factor is less stable, and thus requires a larger phase margin to maintain its stability. With respect to the exemplary embodiment, as the difference of the resolution between the stages is merely one bit, it is not difficult to provide sufficient phase margin in the preceding stage to maintain the circuit stability.

The issues discussed above may be easily overcome without substantively increasing the cost. Compared to the conventional opamp sharing technique, the embodiment of the present invention can perform more bits of conversion. In other words, the present embodiment requires fewer stages than the conventional opamp sharing technique for fixed bits of conversion. The present embodiment can operate at a power consumption comparable to that of the conventional double sampling technique, while avoiding channel mismatch issues.

Figure 4:
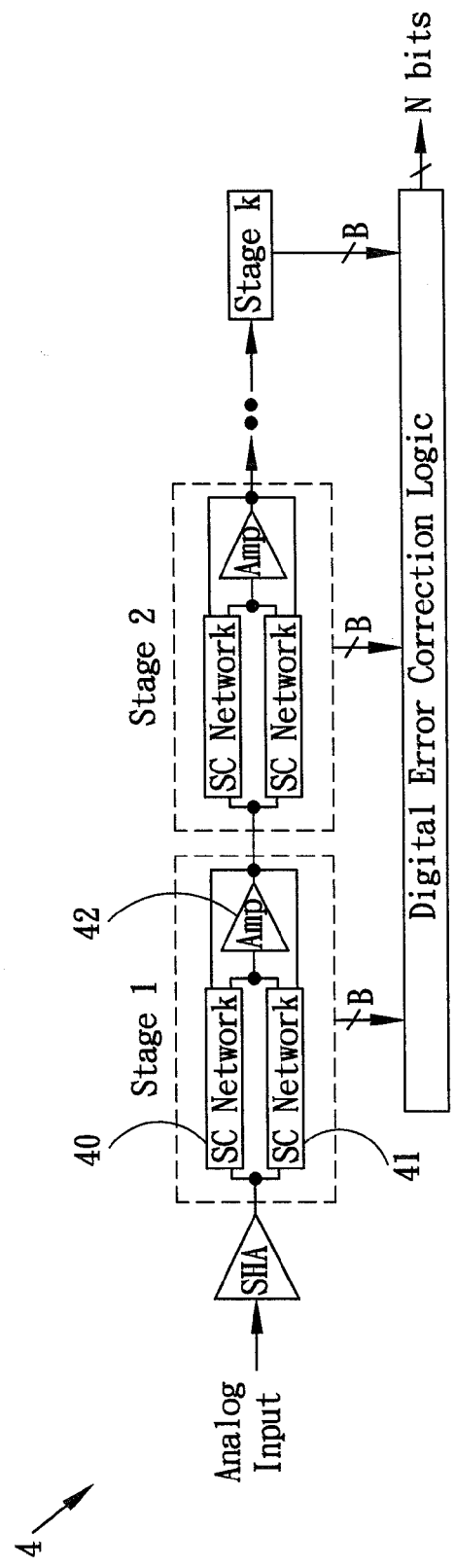
FIG. 4 illustrates a two-channel time-interleaved architecture.
Figure 5:
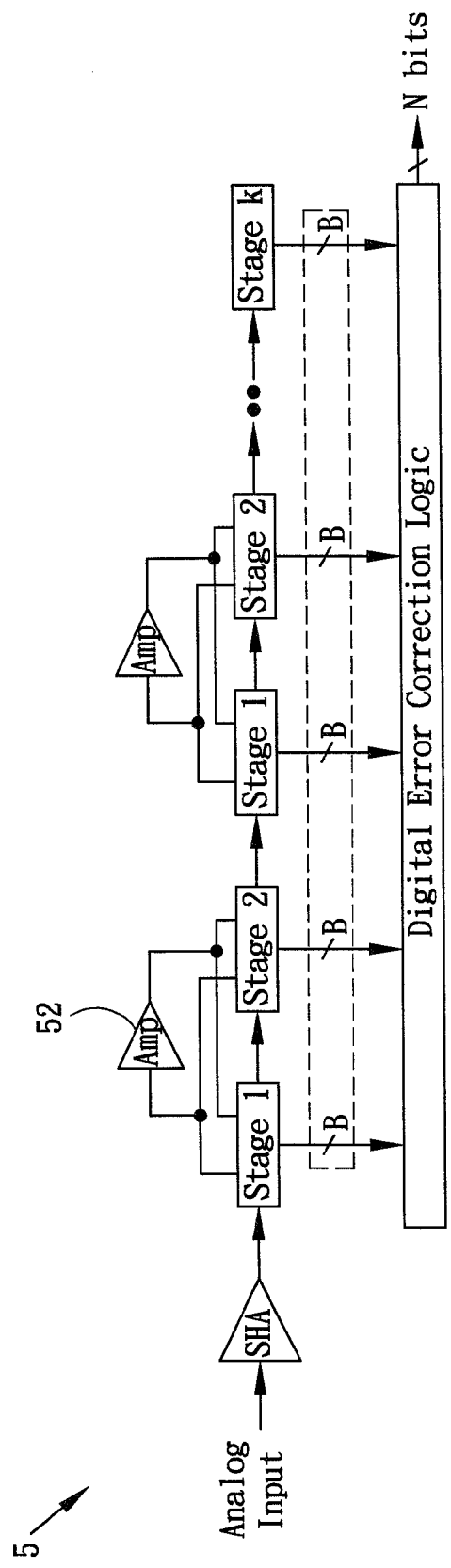
FIG. 5 illustrates a pipelined ADC, in which two neighboring stages share an operational amplifier (opamp)

FIG. 7A to FIG. 7D demonstrate a comparison of the power consumption among the conventional pipelined ADC (FIG. 1), the double-sampling technique (FIG. 4), the opamp sharing technique (FIG. 5) and the embodiment of the present invention (FIG. 6). The comparison results are summarized in Table 1.

Regarding FIG. 7A, a conventional pipelined ADC is depicted in which each stage uses one amplifier. The precision requirement deceases one bit after passing each stage, and the power consumption accordingly decreases in half after passing each stage. The total power consumption is the summation of the twelve stages, where the last stage is ignored. Regarding FIG. 7B, in which a double-sampling technique is illustrated, the power consumption is half the power consumption of FIG. 7A due to the double operating speed of each stage. Regarding FIG. 7C, which corresponds to an opamp sharing technique, only six shared amplifiers are required, and a substantive amount of power is saved.

Figure 7B:
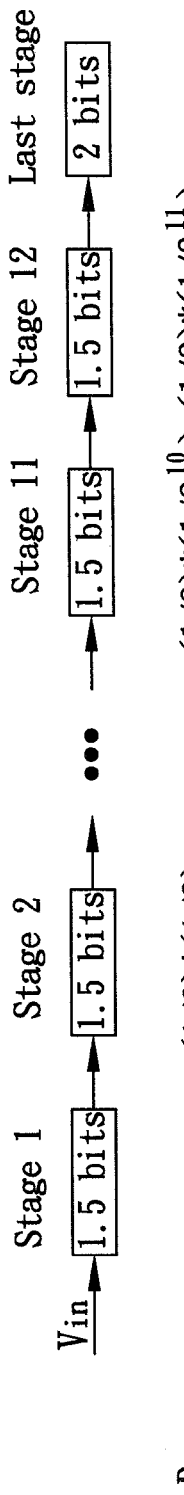
Figure 7C:
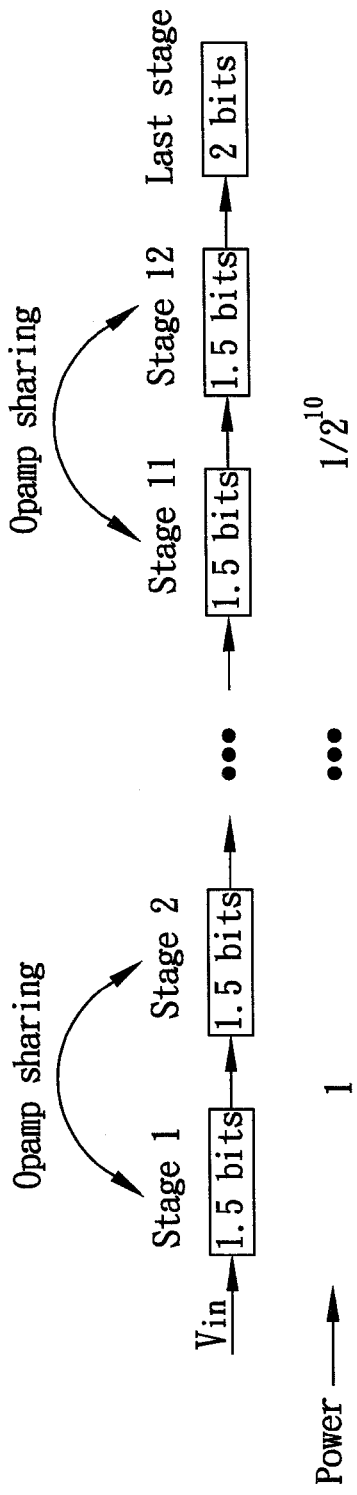
Figure 7D:
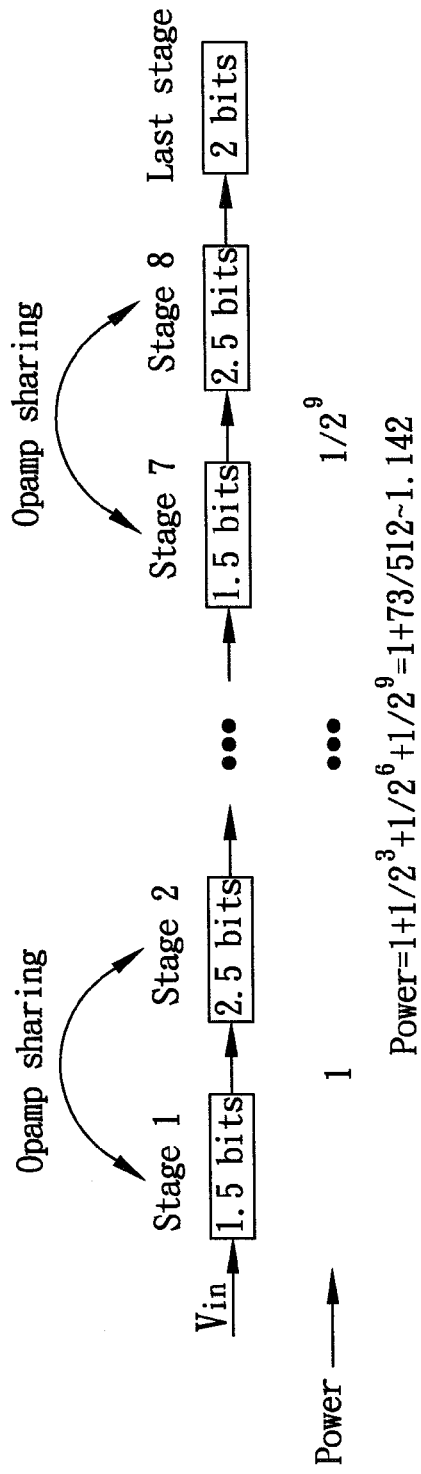

FIG. 7D shows the embodiment of the present invention, in which each amplifier is shared between two neighboring stages and performs three bits of conversion, compared to the two bits of conversion performed by the FIG. 7C technique. Therefore, only four amplifiers are required in the embodiment. A review of Table 1 indicates the double-sampling technique as having the lowest power consumption, with the architecture and process of the present embodiment having the second lowest power consumption. Nevertheless, the double-sampling technique requires additional circuitry to compensate for channel mismatch issues, thus requiring more power consumption and circuit design complexity.

TABLE 1

14 bits ADC

| Technique | power | Required # of opamps |
|---|---|---|
| Conventional | ~2 | 12 |
| Double sampling | ~1 | 12 |
| Opamp sharing | 1.333 | 6 |
| Embodiment | 1.142 | 4 |

Figure 8:
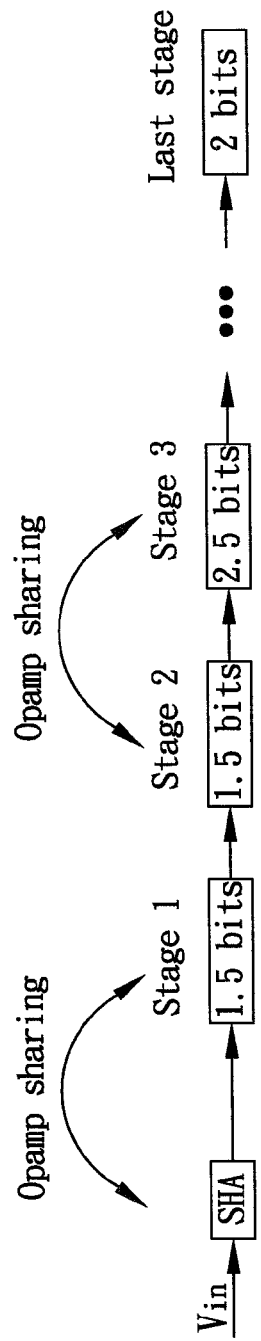
FIG. 8 illustrates a stage-resolution scalable opamp-sharing technique for pipelined ADC according to a modified embodiment of the present invention.

FIG. 8 illustrates a stage-resolution scalable opamp-sharing technique for pipelined ADC according to a modified embodiment of the present invention. In the embodiment, the front-end SHA is used to provide high input bandwidth. The front-end SHA may operate with the first stage in an interleaved manner, such that the front-end SHA may share an amplifier with the first stage, while the second stage shares another amplifier with the third stage, and so on.

Figure 9:
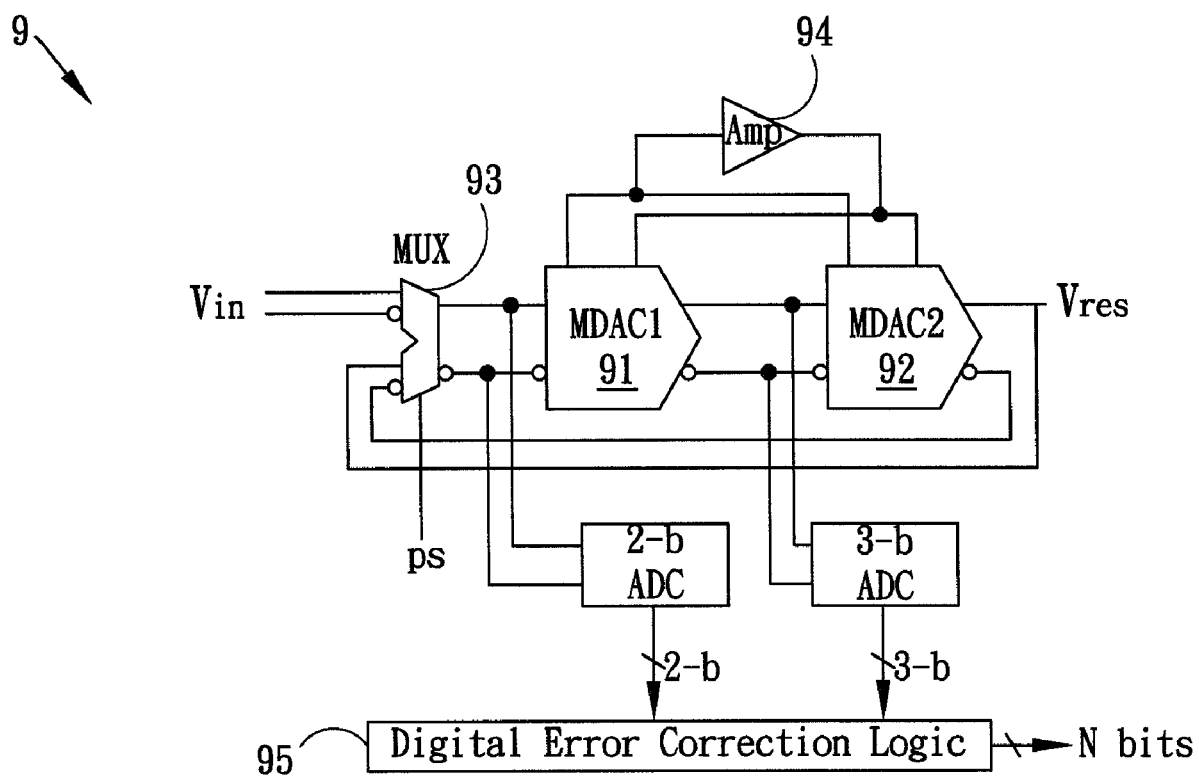
FIG. 9 illustrates a stage-resolution scalable opamp-sharing technique for cyclic ADC according to another embodiment of the present invention.

FIG. 9 illustrates a stage-resolution scalable opamp-sharing technique for cyclic ADC 9 according to another embodiment of the present invention. In the embodiment, the first stage 91 performs conversion on a portion of bits (for example, 2 bits). Subsequently, the first stage 91 generates a residual signal that is fed to the second stage 92, which performs conversion on another portion of bits (for example, 3 bits). The second stage 92 generates a residual signal Vres that is fed back to the first stage 91 through an analog multiplexer 93, thereby completing a cycle of conversion, during which an amplifier 94 is shared. The cyclic ADC 9 further includes digital correction logic 95, which is used to correct and integrate the converted bits, and finally output a complete N-bit code. Compared to the embodiment of FIG. 6, the cyclic ADC 9 repeatedly uses only the two stages, such that substantial silicon area may be saved although at the cost of operating speed. Compared to a conventional cyclic ADC, the cyclic ADC 9 of the embodiment operates faster because it converts more bits in a cycle of conversion.

Although specific embodiments have been illustrated and described, it will be appreciated by those skilled in the art that various modifications may be made without departing from the scope of the present invention, which is intended to be limited solely by the appended claims.

What is claimed is:

1. An analog-to-digital converter (ADC), comprising:
   at least one pair of two stages connected in series, wherein the two stages have different bits of resolution; and
   an amplifier shared by the pair of two stages such that the two stages operate in an interleaved manner;
   wherein a preceding stage of the pair performs fewer bits of conversion than a later stage of the same pair, whereby the ADC has different stage-resolution for every stage.

2. The ADC of claim 1, wherein one stage of the pair undergoes sampling while another stage of the same pair undergoes amplifying, so that the two stages do not use the amplifier at the same time.

3. The ADC of claim 1, wherein the amplifier comprises an operational amplifier (opamp).

4. The ADC of claim 1, wherein the preceding stage of the pair performs 1.5 bits of conversion and the later stage of the same pair performs 2.5 bits of conversion.

5. The ADC of claim 1, wherein the two stages of the pair have different amplification.

6. The ADC of claim 1, wherein each stage of the pair comprises:
   a sub-ADC that performs coarse quantization on an input signal of said stage;
   a sub-DAC (digital-to-analog converter) that converts an output of the sub-ADC to an analog signal;
   a sample-and-hold amplifier (SHA) that samples and holds the input signal of said stage;
   an analog subtractor that subtracts the analog signal from the sampled input signal, resulting in a residual signal; and
   an amplifier that amplifies the residual signal.

7. The ADC of claim 6, further comprising a front-end sample-and-hold amplifier that provides the input signal to the pair of two stages.

8. The ADC of claim 1, further comprising a digital error correction logic circuit that corrects and integrates the outputs of said at least one pair of two stages.

9. The ADC of claim 8, further comprising delay elements connected between the outputs of said at least one pair of two stages and the digital error correction logic circuit, for synchronizing the outputs of said at least one pair of two stages.

10. A stage-resolution scalable opamp-sharing pipelined analog-to-digital converter (ADC), comprising:
 a plurality of series-connected pairs each having two stages connected in series, wherein a preceding stage of the pair performs fewer bits of conversion than a later stage of the same pair, whereby the ADC has different stage-resolution for every stage; and
 a plurality of operational amplifiers (opamps) each being shared by one of the pairs, wherein the two stages operate in an interleaved manner such that one stage of the pair undergoes sampling while another stage of the same pair undergoes amplifying, such that the two stages do not use the shared opamp at the same time.

11. The pipelined ADC of claim 10, wherein the preceding stage of the pair performs 1.5 bits of conversion and the later stage of the same pair performs 2.5 bits of conversion.

12. The pipelined ADC of claim 10, wherein each stage of the pair comprises:
 a sub-ADC that performs coarse quantization on an input signal of said stage;
 a sub-DAC (digital-to-analog converter) that converts an output of the sub-ADC to an analog signal;
 a sample-and-hold amplifier (SHA) that samples and holds the input signal of said stage;
 an analog subtractor that subtracts the analog signal from the sampled input signal, resulting in a residual signal; and
 an amplifier that amplifies the residual signal.

13. The pipelined ADC of claim 12, further comprising a front-end sample-and-hold amplifier that provides the input signal to the first pair of stages.

14. The pipelined ADC of claim 13, wherein the front-end sample-and-hold amplifier and the first pipelined stage share the same amplifier.

15. The pipelined ADC of claim 10, further comprising a digital error correction logic circuit that corrects and integrates the outputs of the plurality of pairs of stages.

16. The pipelined ADC of claim 15, further comprising delay elements connected between the outputs of plurality of pairs of stages and the digital error correction logic circuit, for synchronizing the outputs of the plurality of pairs of stages.

17. A stage-resolution scalable opamp-sharing cyclic analog-to-digital converter (ADC), comprising:
 a pair of two stages connected in series, wherein a preceding stage of the pair performs fewer bits of conversion than a later stage of the same pair, whereby the ADC has different stage-resolution for every stage;
 an operational amplifier (opamp) shared by the pair of two stages, wherein the two stages operate in an interleaved manner such that one stage of the pair is under sampling while another stage of the pair is under amplifying, whereby the two stages do not use the shared opamp at the same time; and
 an analog multiplexer through which an output of the later stage is fed back to the preceding stage after an end of a cycle of conversion.

18. The cyclic ADC of claim 17, wherein the preceding stage of the pair performs 2 bits of conversion and the later stage of the same pair performs 3 bits of conversion.

19. The cyclic ADC of claim 17, wherein each stage of the pair comprises:
 a sub-ADC that performs coarse quantization on an input signal of said stage;
 a sub-DAC (digital-to-analog converter) that converts an output of the sub-ADC to an analog signal;
 a sample-and-hold amplifier (SHA) that samples and holds the input signal of said stage;
 an analog subtractor that subtracts the analog signal from the sampled input signal, resulting in a residual signal; and
 an amplifier that amplifies the residual signal.

20. The cyclic ADC of claim 19, further comprising a front-end sample-and-hold amplifier that provides the input signal to the pair of two stages.

21. The cyclic ADC of claim 17, further comprising a digital error correction logic circuit that corrects and integrates the outputs of the pair of two stages.

* * * * *